United States Patent
Kuo et al.

(10) Patent No.: US 9,810,748 B2
(45) Date of Patent: Nov. 7, 2017

(54) TUNNELING MAGNETO-RESISTOR DEVICE FOR SENSING A MAGNETIC FIELD

(71) Applicant: Industrial Technology Research Institute, Hsinchu (TW)

(72) Inventors: Keng-Ming Kuo, Yunlin County (TW); Ding-Yeong Wang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 142 days.

(21) Appl. No.: 14/967,235

(22) Filed: Dec. 11, 2015

(65) Prior Publication Data
US 2016/0291097 A1 Oct. 6, 2016

(30) Foreign Application Priority Data
Mar. 30, 2015 (TW) .............................. 104110195 A

(51) Int. Cl.
*G01R 33/09* (2006.01)
(52) U.S. Cl.
CPC .................................. *G01R 33/098* (2013.01)
(58) Field of Classification Search
CPC .... G01R 33/09; G01R 33/091; G01R 33/093; G01R 33/098; H01L 43/08
See application file for complete search history.

(56) References Cited

U.S. PATENT DOCUMENTS

| | | |
|---|---|---|
| 7,187,578 B2 | 3/2007 | Hong et al. |
| 7,583,529 B2 | 9/2009 | Chen et al. |
| 7,602,590 B2 | 10/2009 | Zhao et al. |
| 8,059,374 B2 | 11/2011 | Zhao et al. |
| 8,138,561 B2 | 3/2012 | Horng et al. |
| 8,390,283 B2 | 3/2013 | Mather et al. |
| 8,816,683 B2 | 8/2014 | Wang et al. |
| 2005/0200449 A1 | 9/2005 | Oohashi et al. |

(Continued)

FOREIGN PATENT DOCUMENTS

| | | |
|---|---|---|
| CN | 102226835 A | 10/2011 |
| TW | 200536103 | 11/2005 |

(Continued)

OTHER PUBLICATIONS

Fujiwara et al., "Fabrication of Magnetic Tunnel Junctions with a Bottom Synthetic Antiferro-Coupled Free Layers for High Sensitive Magnetic Field Sensor Devices," Journal of Applied Physics, Mar. 2012, 4 pages, vol. 111, Issue 7, AIP Publishing, US.

(Continued)

*Primary Examiner* — David M. Schindler

(57) ABSTRACT

A tunneling magneto-resistor (TMR) device for sensing a magnetic field includes a first TMR sensor having a first MTJ (magnetic tunneling junction) device and a second MTJ device connected in parallel. Each of the first and second MTJ devices has a pinned layer and a free layer. The pinned layer of each of the first and second MTJ devices has a pinned magnetization at a first pinned direction. The free layers of the first and second MTJ devices have a first free magnetization parallel to and a second free magnetization anti-parallel to a first easy-axis respectively.

11 Claims, 13 Drawing Sheets

(56) References Cited

U.S. PATENT DOCUMENTS

| | | | |
|---|---|---|---|
| 2008/0272771 A1* | 11/2008 | Guo ..................... | B82Y 25/00 324/260 |
| 2009/0243607 A1 | 10/2009 | Mather et al. | |
| 2012/0068698 A1 | 3/2012 | Chen et al. | |
| 2013/0168788 A1 | 7/2013 | Wang et al. | |
| 2013/0229175 A1* | 9/2013 | Wang ................. | G01R 33/098 324/252 |
| 2014/0111195 A1* | 4/2014 | Kuo ..................... | G01R 33/098 324/252 |
| 2014/0292312 A1 | 10/2014 | Chen et al. | |
| 2014/0295579 A1 | 10/2014 | Guo | |

FOREIGN PATENT DOCUMENTS

| | | |
|---|---|---|
| TW | I278860 | 4/2007 |
| TW | I431301 B | 3/2014 |
| TW | I440875 | 6/2014 |
| TW | I452319 | 9/2014 |

OTHER PUBLICATIONS

Naik et al., "Electric-Field Tunable Magnetic-Field-Sensor Based on CoFeB/MgO Magnetic Tunnel Junction," Applied Physics Letters, Jun. 2014, 5 pages, vol. 104, Issue 23, AIP Publishing, US.

Fujiwara et al., "Fabrication of Magnetic Tunnel Junctions with a Synthetic Ferrimagnetic Free Layer for Magnetic Field Sensor Applications," Japanese Journal of Applied Physics, Jan. 2011, 4 pages, vol. 50, No. 1R, The Japan Society of Applied Physics, Japan.

Shah et al., "Magnetic Tunneling Junction Based Magnetic Field Sensors: Role of Shape Anisotropy Verses Free Layer Thickness," Journal of Applied Physics, Apr. 2011, 4 pages, vol. 109, Issue 7, AIP Publishing, US.

Takenaga et al., "Magnetic Tunnel Junctions for Magnetic Field Sensor by Using CoFeB Sensing Layer Capped with MgO Film," Journal of Applied Physics, Mar. 2014, 4 pages, vol. 115, Issue 17, AIP Publishing, US.

Chen et al., "Yoke-Shaped MgO-Barrier magnetic Tunnel Junction Sensors," Applied Physics Letters, Dec. 2012, 6 pages, vol. 101, No. 26, American Institute of Physics, US.

Egelhoff Jr., et al. "Magnetic Tunnel Junctions with Large Tunneling Magnetoresistance and Small Saturation Fields," Journal of Applied Physics, Apr. 2010, 3 pages, vol. 107, Issue 9, AIP Publishing, US.

Teixeira et al., "Evidence of Spin-Polarized Direct Elastic Tunneling and Onset of Superparamagnetism in MgO Magnetic Tunnel Junctions," Applied Physics Letters, Apr. 2010, 9 pages, vol. 81, Issue 13, AIP Publishing, US.

Almeida et al., "Field Detection in Single and Double Barrier MgO Magnetic Tunnel Junction Sensors, " Journal of Applied Physics, Mar. 2008, 4 pages, vol. 103, Issue 7, AIP Publishing, US.

Nazarov et al., "Tunable Ferromagnetic Resonance Peak in Tunneling Magnetoresisttive Sensor Structures," Applied Physics Letters, Dec. 2002, 4559-4561, vol. 81, No. 24, AIP Publishing, US.

* cited by examiner

TUNNELING MAGNETO-RESISTOR DEVICE FOR SENSING A MAGNETIC FIELD

CROSS REFERENCE TO RELATED APPLICATIONS

The application is based on, and claims priority from, TAIWAN Application Serial No. 104110195, filed on Mar. 30, 2015, the disclosure of which is hereby incorporated by reference herein in its entirety.

TECHNICAL FIELD

The disclosure relates to magnetic field sensing technology, and particularly it relates to a tunneling magneto-resistor device for sensing magnetic fields.

BACKGROUND

Electronic compasses have been installed in consumer electronic products to improve performance. For example, electronic compasses are applied to Global Positioning Systems (GPS) to improve positioning ability. In GPS, the forward direction is determined by measuring the movement of an object. However, the GPS cannot accurately position the object when the object moving at a low speed, or stationary. The electronic compasses can provide azimuth information for determining the forward direction.

Many schemes for sensing magnetic fields have been proposed, such as typical Hall devices or magneto-resistive devices. The magneto-resistive devices include anisotropic magneto-resistors (ARMs), giant magneto-resistors (GMRs) and tunneling magneto-resistors (TMRs). Compared with the Hall devices, the magneto-resistive devices have good sensitivity, and the back-end fabrication process for the magneto-resistive devices is easily integrated with the front-end CMOS fabrication process.

A typical TMR for a magnetic field sensor 95 is shown in FIGS. 1A to 1B. The TMR 95 includes a bottom plate of conducting metal, serving as a bottom electrode 102 formed on a substrate 90, an MTJ (Magnetic Tunneling Junction) device 110 formed on the bottom electrode 102 and a top plate of conducting material, serving as a top electrode 106 formed on the MTJ device 110. From the structural pattern of the MTJ device, one can define a cross having an intersection at the center, wherein the longer length is called a major axis 101 and the shorter length is called a minor axis 103. A line called an easy-axis 180 is collinear with a major axis 101. The MTJ device 110 includes a pinned layer 112, a tunneling layer 115 and a free layer 116, in which the MTJ device 110 is sandwiched between the bottom electrode 102 and the top electrode 106, for example. The pinned layer 112 is made of magnetic material formed on the bottom electrode 102 and has a first pinned magnetization 114, parallel to a pinned direction. The tunneling layer 115 of non-magnetic material is formed on the pinned layer 112. The free layer 116 of magnetic material is formed on the tunneling layer 115 and has a first free magnetization 118, initially parallel to the easy axis 180.

After the MTJ device is formed (i.e. after magnetic thin film stacking and pattern etching), the pinned direction is set by applying a magnetic field thereto during an annealing process. After the annealing process, the pinned direction will be parallel to the direction of the applied magnetic field, and the free magnetization tends to be parallel to the easy-axis due to the shape anisotropy. Therefore, the magnetic field sensing direction of the TMR is perpendicular to the easy-axis 180.

Through AMR or even GMR, an integrated horizontal 2-axis magnetic field sensor can be achieved, but their footprint sizes are quite large. Because of a very low resistivity, the device length has to be long enough to provide a usable value for sensing magnetic fields. FIGS. 2A and 2B are drawings, schematically illustrating a Wheatstone bridge circuit without and with shielding. As shown in FIG. 2A, the Wheatstone bridge circuit is a popular method for transforming the sensed magnetic field into an electronic signal. For the AMR magnetic sensor, each element R11, R21, R12, R22 of the bridge circuit is a series connection of several Barber pole biased AMRs and the shorting bar angles of adjacent elements are complementary, so that the bridge circuit is symmetric and full range operable. However, for the GMR or TMR magnetic field sensor, due to their symmetric magneto-resistance and magnetic field characteristics, two elements R21, R12 therefore must be shielded, as shown in FIG. 2B, and the bridge circuit only performs half range operation. For TMRs having high magneto-resistance ratio, the asymmetric half range operation of the bridge circuit results in losing linearity and accuracy of the output signal.

SUMMARY

In one exemplary embodiment of the disclosure, a tunneling magneto-resistor (TMR) device for sensing magnetic fields comprises: a first TMR (tunneling magneto-resistor) sensor comprising a first and a second MTJ (magnetic tunneling junction) device connected in parallel, each of the first and second MTJ device having a pinned layer and a free layer, wherein each of the pinned layers of the first and second MTJ devices has a pinned magnetization at a first pinned direction, the free layer of the first MTJ device has a first free magnetization parallel to a first easy-axis and the free layer of the second MTJ device has a second free magnetization anti-parallel to the first easy-axis.

In another exemplary embodiment of the disclosure, a tunneling magneto-resistor device for sensing magnetic fields comprises: a first TMR (tunneling magneto-resistor) sensor comprising a first and a second MTJ (magnetic tunneling junction) device connected in parallel, each of the first and second MTJ device having a pinned layer and a free layer; a second TMR sensor comprising a third and a fourth MTJ device connected in parallel, each of the third and fourth MTJ device having a pinned layer and a free layer; a third TMR sensor comprising a fifth and a sixth MTJ device connected in parallel, each of the fifth and sixth MTJ device having a pinned layer and a free layer; and a fourth TMR sensor comprising a seventh and an eighth MTJ device connected in parallel, each of the seventh and eighth MTJ device having a pinned layer and a free layer.

Each of the pinned layers of the first and second MTJ devices has a pinned magnetization at a first pinned direction; the free layer of the first MTJ device has a first free magnetization parallel to a first easy-axis and the free layer of the second MTJ device has a second free magnetization anti-parallel to the first easy-axis. First terminals of the first and fourth TMR sensors are connected to a first voltage node; first terminals of the third and second TMR sensors are connected to a second voltage node; second terminals of the first and third TMR sensors are connected together, and second terminals of the second and fourth TMR sensors are connected together. Each of the pinned layers of the third and fourth MTJ devices has a pinned magnetization at the first pinned direction; the free layer of the third MTJ device has a third free magnetization parallel to the first easy-axis and the free layer of the fourth MTJ device has a fourth free magnetization anti-parallel to the first easy-axis.

The first free magnetization and the first pinned magnetization have a first angle of α degrees therebetween; the third free magnetization and the third pinned magnetization have the first angle of α degrees therebetween; the second free magnetization and the second pinned magnetization have an second angle of π-α degrees therebetween; the fourth free magnetization and the fourth pinned magnetization have the second angle of π-α degrees therebetween; and α is not zero.

Each TMR sensor in the TMR device of the disclosure comprises two MTJ devices connected in parallel, each of the MTJ devices having a pinned layer and a free layer. Furthermore, the angles (α, π-α) between the free magnetization and the pinned magnetization respectively in the two MTJ devices are complementary. Therefore, the conductance of the TMR sensor is linearly proportional to the variation of the external magnetic field in a tolerable sensing range.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF DISCLOSED EMBODIMENTS

The following description is the best-contemplated mode of carrying out the disclosure. This description is made for the purpose of illustrating the general principles of the disclosure and should not be taken in a limiting sense. The scope of the invention is best determined by reference to the appended claims.

Figure 1A:
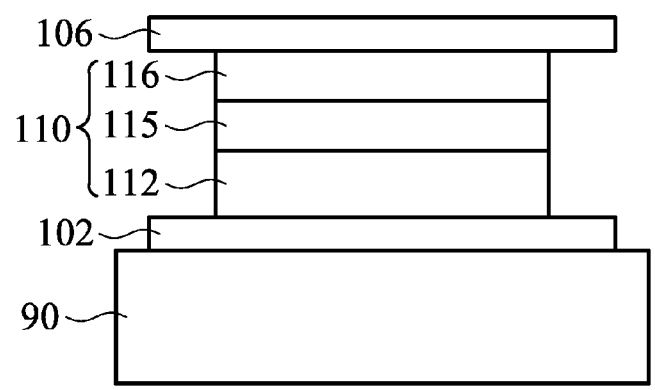
FIG. 1A schematically shows, from a cross-sectional view, a typical TMR for a magnetic field sensor.
Figure 1B:
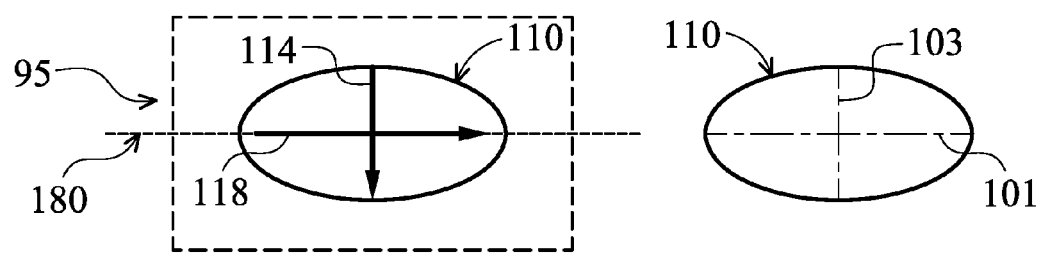
FIG. 1B schematically shows a top view of the typical TMR for a magnetic field sensor in FIG. 1A.
Figure 2B:
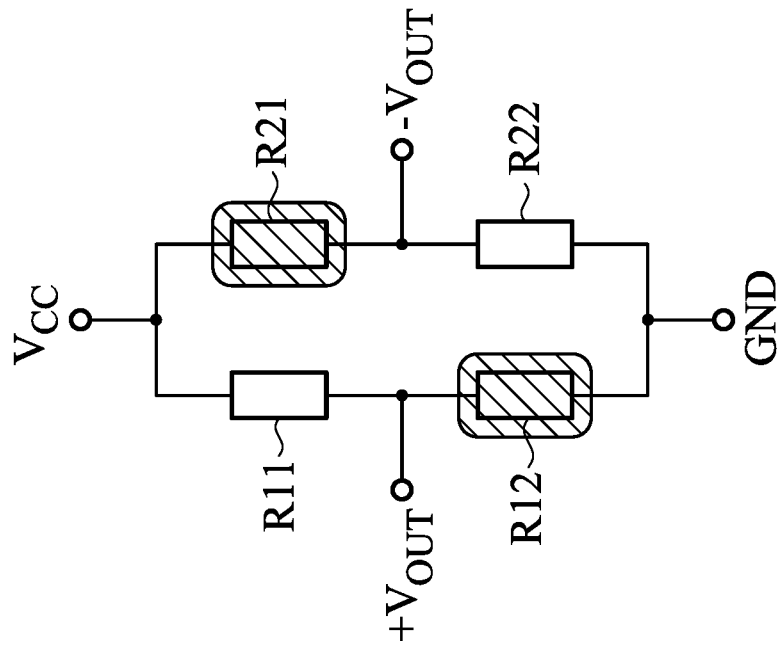
FIGS. 2A and 2B are drawings, schematically illustrating a Wheatstone bridge circuit without and with shielding.
Figure 2A:
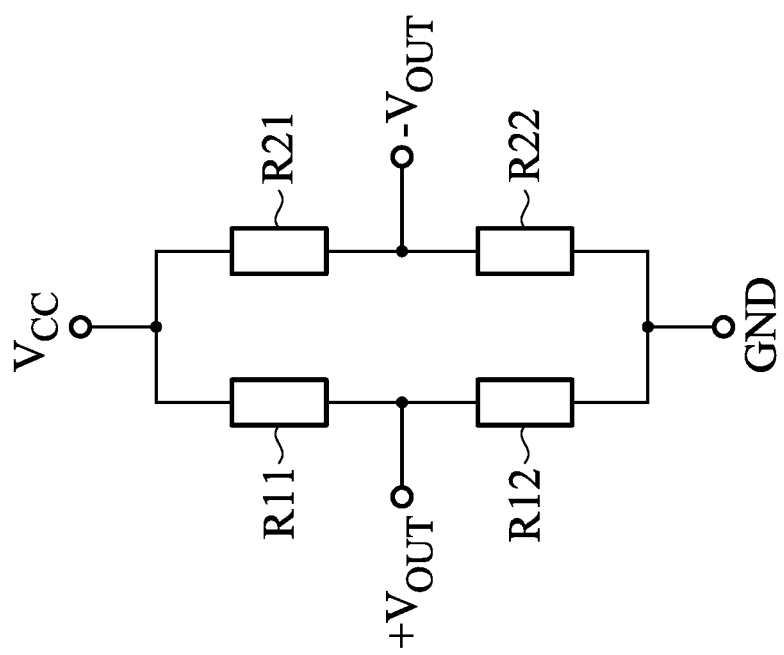
Figure 3A:
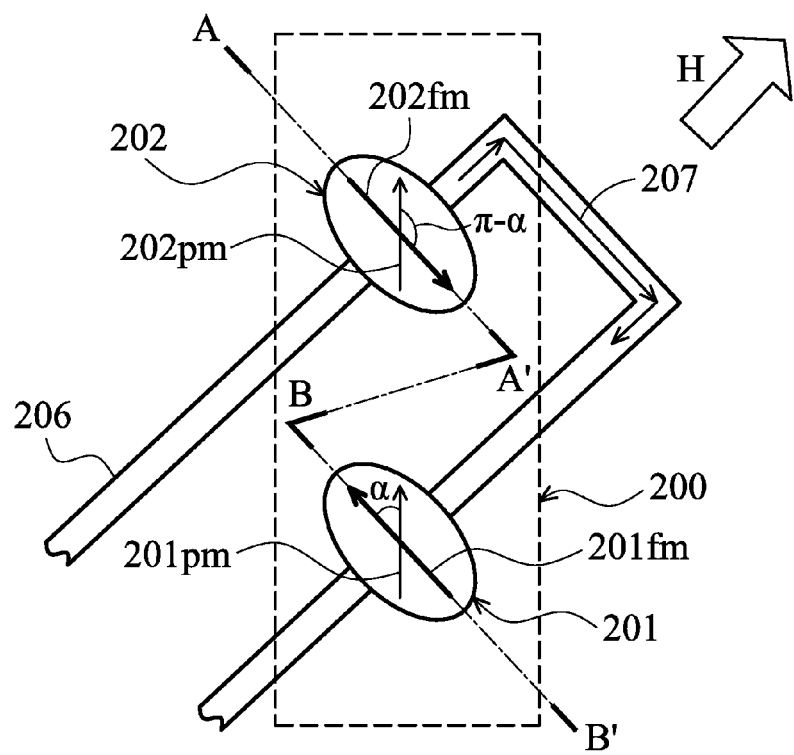
FIGS. 3A~3B are drawings, schematically illustrating a top view and a cross-sectional view of a TMR (tunneling magneto-resistor) sensor 200 according to an exemplary embodiment of the disclosure.
Figure 3B:
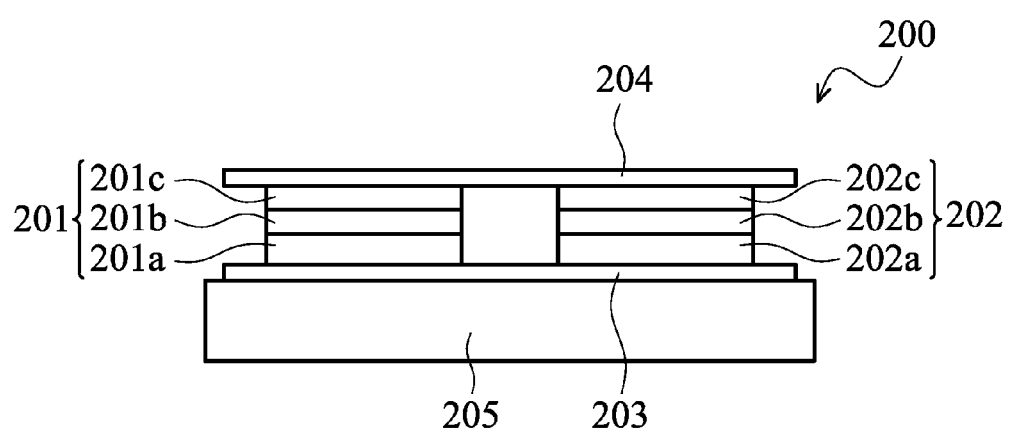

Following description discloses tunneling magneto-resistor (TMR) devices for sensing magnetic fields according to exemplary embodiments of the disclosure. FIGS. 3A and 3B are drawings, schematically illustrating a top view and a cross-sectional view along the lines A-A' and B-B' at an easy-axis (direction) of a TMR sensor according to an exemplary embodiment of the disclosure.

In FIGS. 3A and 3B, the TMR sensor 200 has a first MTJ (Magnetic Tunneling Junction) device 201 and a second MTJ device 202. A bottom electrode 203 is formed on a substrate 205 and the first MJT device 201 and the second MJT device 202 are formed thereon. A top electrode 204 is formed on the first and second MTJ devices 201 and 202, thereby connecting the first and second MTJ devices 201 and 202 in parallel.

The first MTJ device 201 comprises a first pinned layer 201a of magnetic material formed on the bottom electrode 203 and has a first pinned magnetization 201pm. A first tunneling layer 201b of non-magnetic material is formed on the first pinned layer 201a. A first free layer 201c of magnetic material is formed on the first tunneling layer 201b and has a first free magnetization 201fm. The top electrode 204 connects to the first free layer 201c.

The second MTJ device 202 comprises a second pinned layer 202a of magnetic material formed on the bottom electrode 203 and has a second pinned magnetization 202pm. A second tunneling layer 202b of non-magnetic material is formed on the second pinned layer 202a. A second free layer 202c of magnetic material is formed on the second tunneling layer 202b and has a second free magnetization 202fm. The top electrode 204 connects to the second free layer 202c.

The first and second MTJ devices 201 and 202 are simultaneously made by the same fabrication process, and easy axes (major axes) of the first and second MTJ devices 201 and 202 are in parallel. During the annealing process, a magnetic field is applied in a pinned direction such that the first and second pinned layers 201a and 202a of the first and second MTJ devices 201 and 202 are of the same magnetization direction. Thus, the first and second pinned magnetizations 201pm and 202pm are along the same direction, i.e., along the desired magnetization directions by applying a magnetic field during the annealing process.

The magnetization directions of the free layers 201c and 202c are set by using an ampere field generated by providing a current through the conduction line 206 disposed below (or above) the first and second MTJ devices 201 and 202, for example. Numeral 207 indicates the current direction in the conduction line 206 for setting the initial direction of free magnetizations. After applying the ampere field, the first free magnetization 201fm is anti-parallel to the first pinned magnetization 202fm, i.e., the first and second free magnetizations 201fm and 202fm are respectively parallel to and anti-parallel to the easy-axis. In addition, the first free magnetization 201*fm* and the first pinned magnetization 201*pm* have a first angle of α degrees therebetween, and the second free magnetization 202*fm* and the second pinned magnetization 202*pm* have a second angle of π-α degrees therebetween.

Figure 4A:
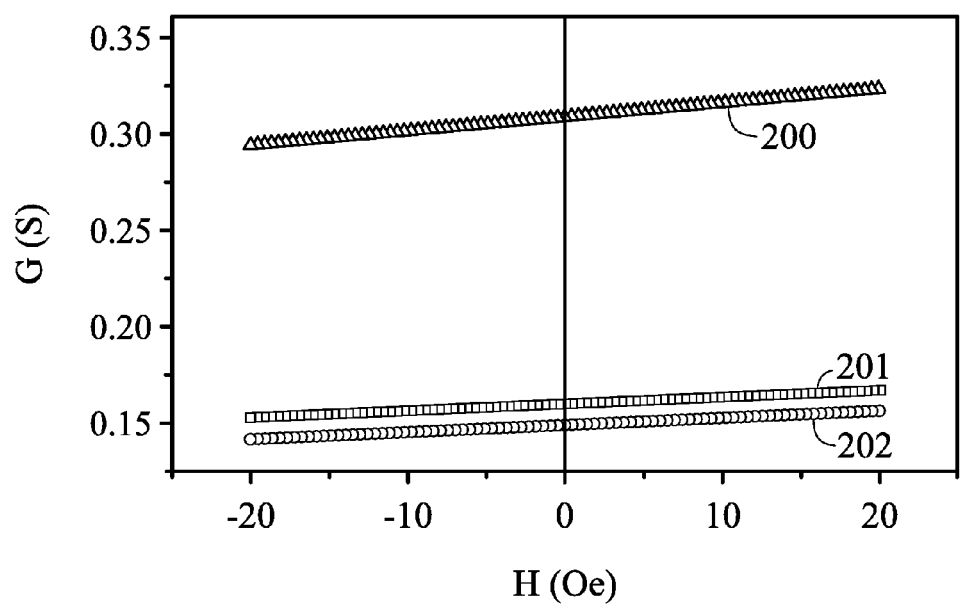
FIGS. 4A~4B show the relationship between the conductance (G) of the TMR sensor 200 with respect to the applied magnetic field.
Figure 4B:
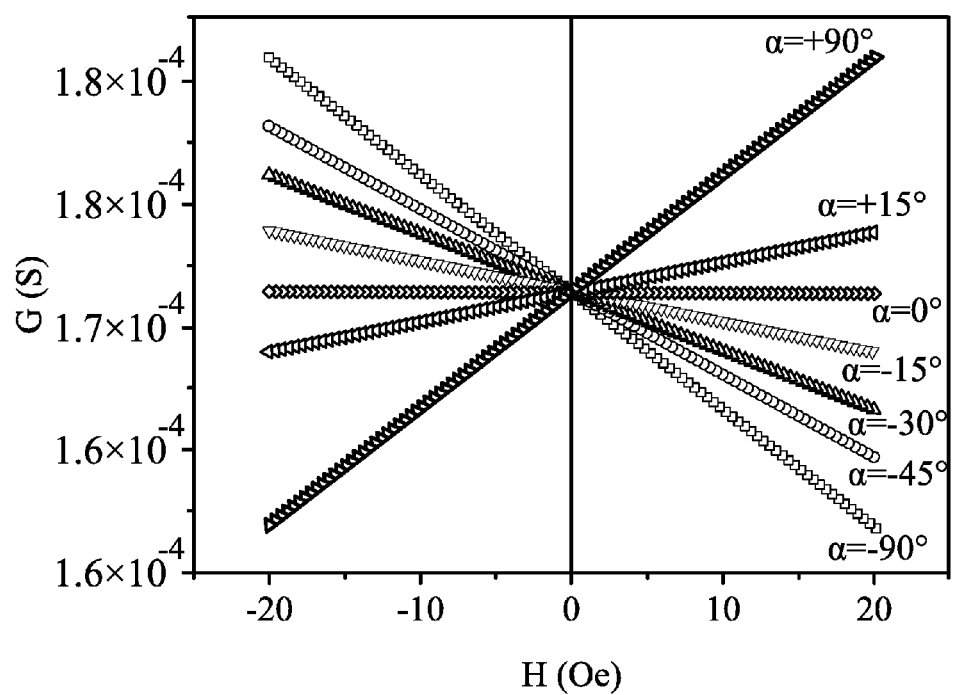

FIGS. 4A and 4B show the variance of the conductance (G; (arb. Unit)) of the TMR sensor 200 with respect to the applied magnetic field H along the direction perpendicular to the easy axis, based on a micromagnetic simulation. In view of FIG. 4A (e.g., α is 75 degrees), the conductance of the TMR sensor 200 is substantially linear with respect to the magnetic field H when the applied magnetic field H is in the range of −20~+20 Oe. In view of FIG. 4B, the conductance of the TMR sensor 200 is still linear with respect to the magnetic field when α is changed between −90~+90 degrees and the applied magnetic field is in the range of −20~+20 Oe.

Figure 5A:
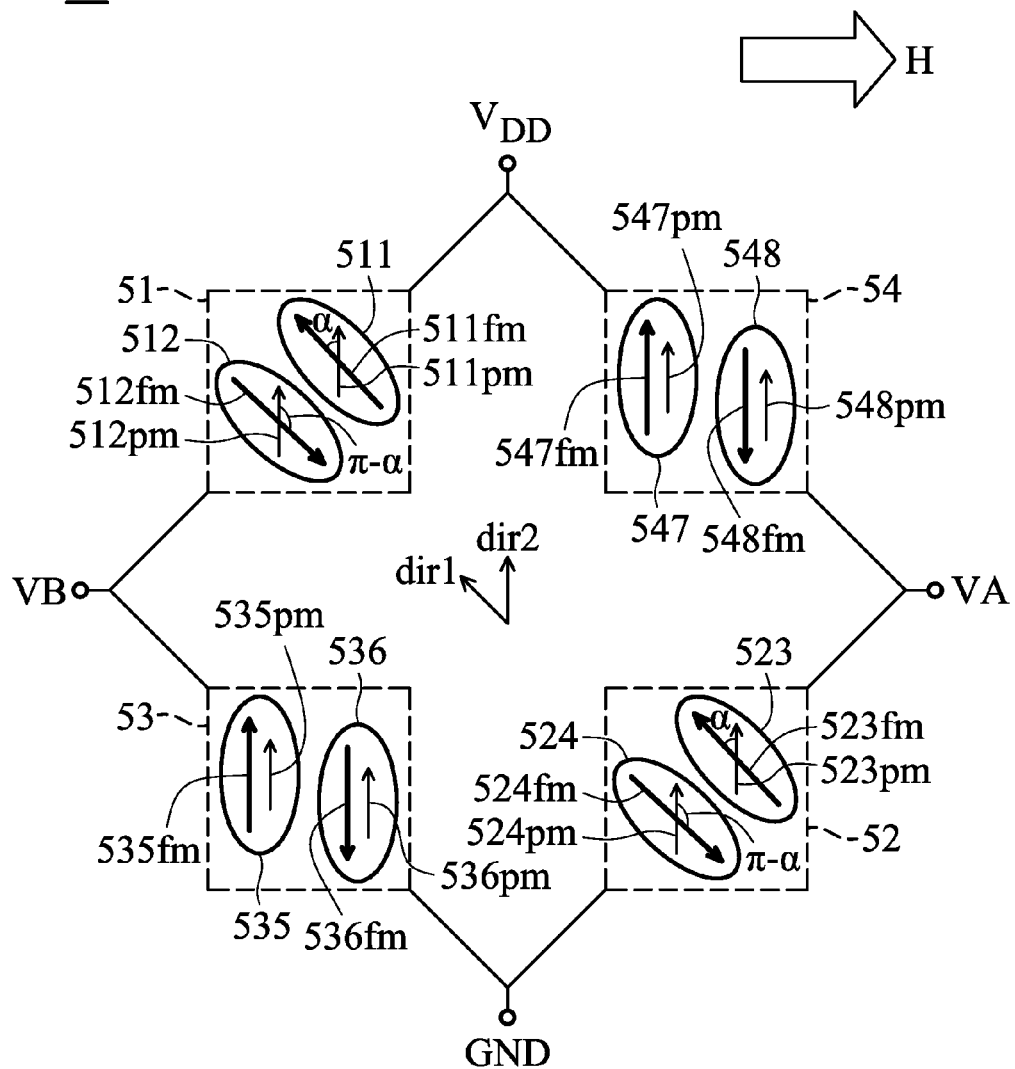
FIG. 5A schematically shows a TMR device 50 with bridge structure according to another exemplary embodiment of the disclosure.

FIG. 5A schematically shows a TMR device 50 with bridge structure for sensing magnetic fields according to another exemplary embodiment of the disclosure. The TMR device 50 comprises a first TMR sensor 51 having a first MTJ device 511 and a second MTJ device 512 connected in parallel, each of the first and second MTJ device having a pinned layer and a free layer; a second TMR sensor 52 having a third MTJ device 523 and a fourth MTJ device 524 connected in parallel, each of the third and fourth MTJ device having a pinned layer and a free layer; a third TMR sensor 53 having a fifth MTJ device 535 and a sixth MTJ device 536 connected in parallel, each of the fifth and sixth MTJ device having a pinned layer and a free layer; and a fourth TMR sensor 54 having a seventh MTJ device 547 and an eighth MTJ device 548 connected in parallel, each of the seventh and eighth MTJ device having a pinned layer and a free layer. The first to eighth MTJ devices have the structure shown in FIG. 3B, and thus are not described further. Moreover, the conduction line for setting the free magnetization directions is omitted for brevity.

Referring to FIG. 5A, the pinned layers of the first and second MTJ devices 511, 512 respectively have a first pinned magnetization 511*pm* and a second pinned magnetization 512*pm*, at a first pinned direction (dir2). The free layer of the first MTJ device 511 has a first free magnetization 511*fm* parallel to a first easy-axis (or main-axis) in a direction (dir1) and the free layer of the second MTJ device 512 has a second free magnetization 512*fm* anti-parallel to the first easy-axis (dir1).

The pinned layers of the third and fourth MTJ devices 523, 524 respectively have a first pinned magnetization 523*pm* and a second pinned magnetization 524*pm* at the first pinned direction (dir2). The free layer of the third MTJ device 523 has a first free magnetization 523*fm* parallel to the first easy-axis and the free layer of the fourth MTJ device 524 has a second free magnetization 524*fm* anti-parallel to the first easy-axis.

The pinned layers of the fifth to the eighth MTJ devices 535, 536, 547 and 548 respectively have pinned magnetizations 535*pm*, 536*pm*, 547*pm* and 548*pm* at the first pinned direction (dir2). The free layers of the fifth and seventh MTJ devices 535, 547 respectively have a fifth and a seventh free magnetization 535*fm*, 547*fm* parallel to a second easy-axis, the free layers of the sixth and eighth MTJ devices 536, 548 respectively have a sixth and an eighth free magnetization 536*fm*, 548*fm* anti-parallel to the second easy-axis. The second easy-axis is parallel to the first pinned direction (dir2), and the directions dir1, dir2 of the first and the second easy-axes are not parallel to each other. Dir 1 is defined the direction 1, and dir 2 is defined the direction 2, and dir 3 is defined the direction 3 as below.

Moreover, the pinned magnetizations of the first to eighth MJT devices are set to the desired magnetization directions by applying a magnetic field during a single annealing process. In FIG. 5A, the angles α and π-α represent the angles between the pinned magnetizations and the free magnetizations in a single MTJ device.

Furthermore, first terminals of the first and fourth TMR sensors 51, 54 are connected to a first voltage node (such as a voltage node VDD); first terminals of the third and second TMR sensors 53, 52 are connected to a second voltage node (such as a reference ground GND); second terminals of the first and third TMR sensors 51, 53 are connected to a test node VB; and second terminals of the second and fourth TMR sensors 52, 54 are connected to a test node VA.

Figure 5B:
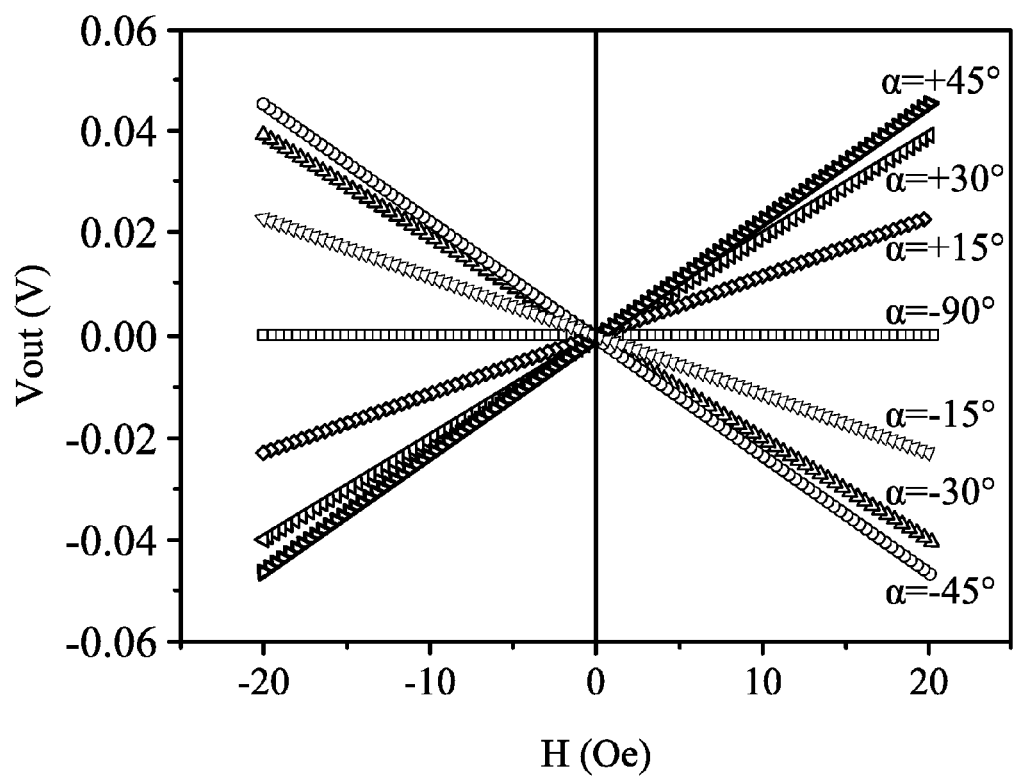
FIG. 5B shows the relationship between output voltages (Vout) of the TMR device 50 in FIG. 5A with respect to the applied magnetic field H, under different angles (α)

FIG. 5B shows the relationship between output voltages (Vout) of the TMR device 50 in FIG. 5A with respect to the applied magnetic field H, under different angles of α degrees. As shown in FIG. 5B, the voltages of the TMR device 50, measured at the test nodes VA and VB is substantially linear with respect to the applied magnetic field H when α is changed between −45~+45 degrees and the applied magnetic field H is in the range of −20~+20 Oe.

Figure 6A:
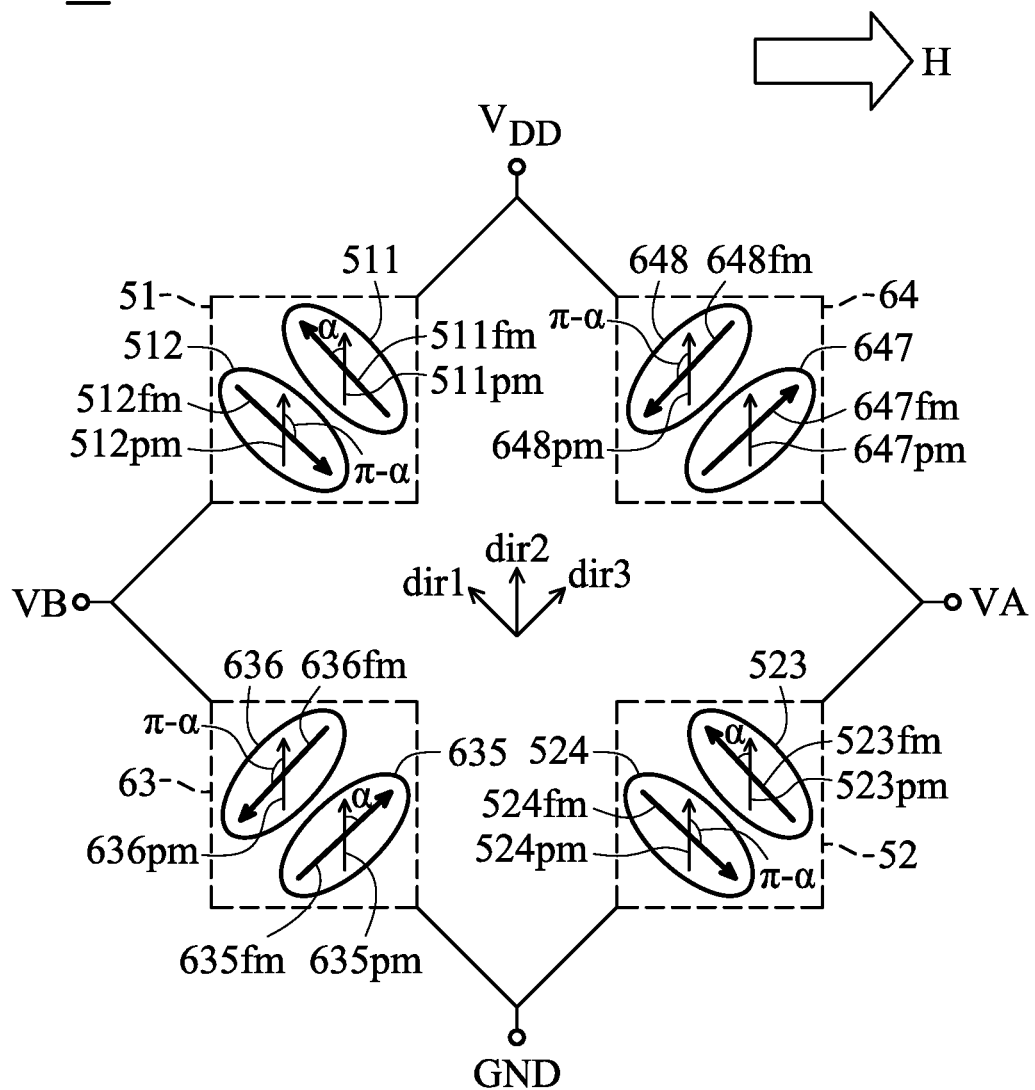
FIG. 6A schematically shows a TMR device 60 with bridge structure according to another exemplary embodiment of the disclosure.

FIG. 6A schematically shows a TMR device 60 with bridge structure according to another exemplary embodiment of the disclosure. For brevity, same numerals and notations are used to indicate the same elements described in FIG. 5A.

The TMR device 60 comprises a first, second, third and fourth TMR sensor 51, 52, 63, 64, the connection structure of which is the same as described in FIG. 5A. The difference between the TMR device 60 in FIG. 6A and the TMR device 50 in FIG. 5A is the third TMR sensor 63 and the fourth TMR sensor 64.

The third TMR sensor 63 comprises a fifth MTJ device 635 and a sixth MTJ device 636 connected in parallel, each of the fifth and sixth MTJ devices having a pinned layer and a free layer. The fourth TMR sensor 64 comprises a seventh MTJ device 647 and an eighth MTJ device 648 connected in parallel, each of the seventh and eighth MTJ devices having a pinned layer and a free layer.

Referring to FIG. 6A, the pinned layers of the fifth to eighth MTJ devices 635, 636, 647 and 648 respectively have pinned magnetizations 635*pm*, 636*pm*, 647*pm* and 648*pm* at the first pinned direction (dir2). The free layers of the fifth and seventh MTJ devices 635 and 647 respectively have a fifth free magnetization 635*fm* and a seventh free magnetization 647*fm* parallel to a third easy-axis (dir3). The free layers of the sixth and eighth MTJ devices 636 and 648 respectively have a sixth free magnetization 636*fm* and an eighth free magnetization 648*fm* anti-parallel to the third easy-axis (dir3). In one example, the third easy-axis (dir3) is perpendicular to the first easy-axis (dir1).

Moreover, the pinned magnetizations of the first to eighth MJT devices are set to the desired directions by applying a magnetic field during a single annealing process. In FIG. 6A, the angles α, π-α represent the angles between the pinned magnetizations and the free magnetizations in a single MTJ device.

Figure 6B:
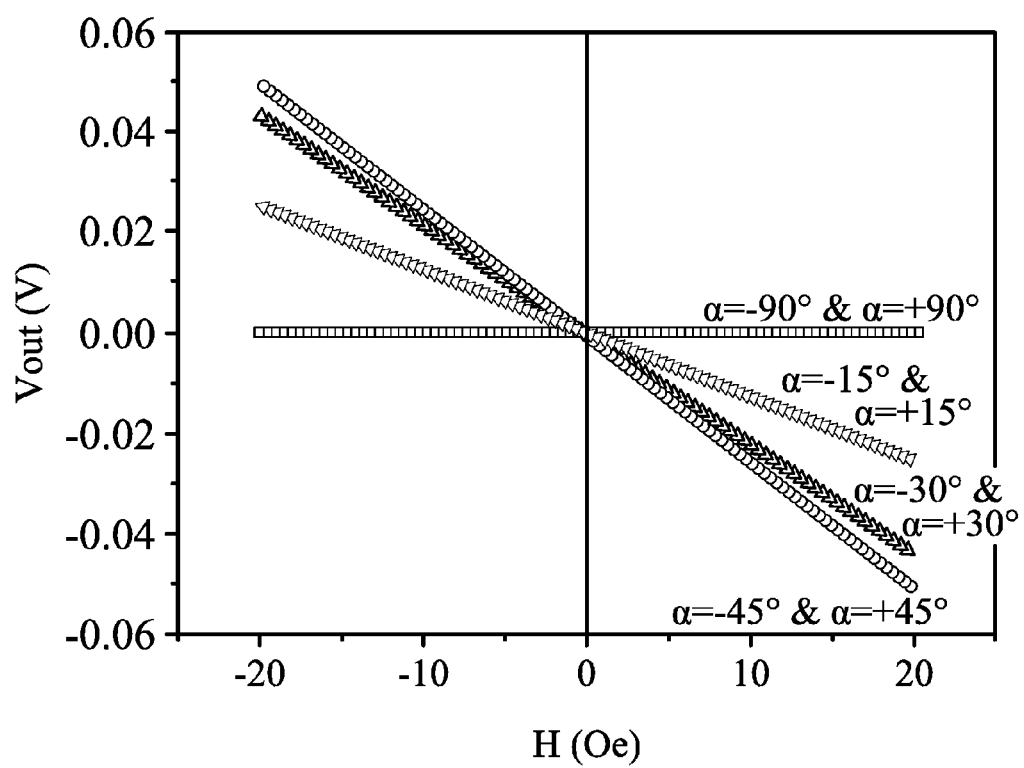
FIG. 6B shows the relationship between output voltages (Vout) of the TMR device 60 in FIG. 6A with respect to the applied magnetic field H, under different angles (α)

FIG. 6B shows the relationship between output voltages (Vout) of the TMR device 60 in FIG. 6A with respect to the applied magnetic field H, under different angles (α). As shown in FIG. 6B, the output voltage of the TMR device 60, measured at the test nodes VA and VB is substantially linear with respect to the applied magnetic field H when α is changed between −45~+45 degrees and the applied magnetic field H is in the range of −20~+20 Oe.

Figure 7A:
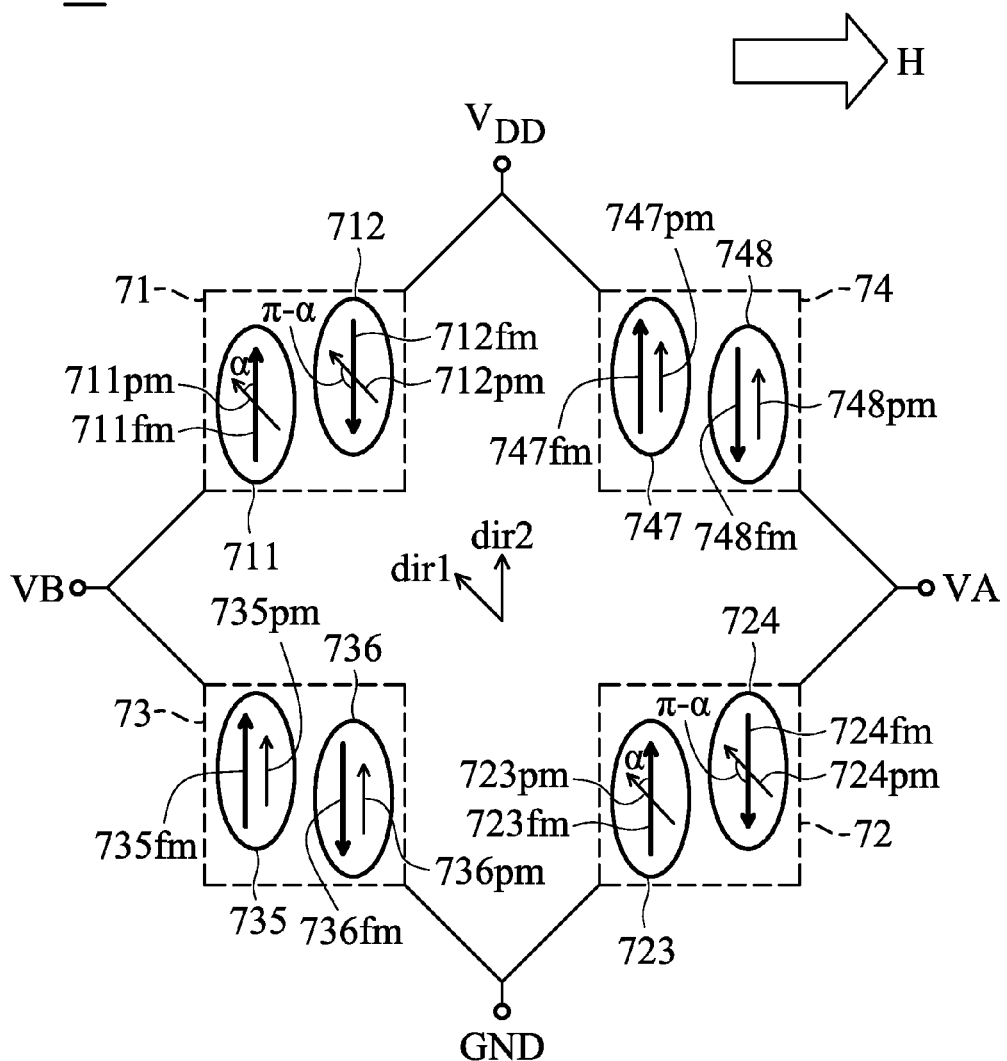
FIG. 7A schematically shows a TMR device 70 with bridge structure according to another exemplary embodiment of the disclosure.

FIG. 7A schematically shows a TMR device 70 with bridge structure according to another exemplary embodiment of the disclosure. The TMR device 70 comprises a first TMR sensor 71 having a first MTJ device 711 and a second MTJ device 712 connected in parallel, each of the first and second MTJ devices having a pinned layer and a free layer; a second TMR sensor 72 having a third MTJ device 723 and a fourth MTJ device 724 connected in parallel, each of the third and fourth MTJ devices having a pinned layer and a free layer; a third TMR sensor 73 having a fifth MTJ device 735 and a sixth MTJ device 736 connected in parallel, each of the fifth and sixth MTJ devices having a pinned layer and a free layer; and a fourth TMR sensor 74 having a seventh MTJ device 747 and an eighth MTJ device 748 connected in parallel, each of the seventh and eighth MTJ devices having a pinned layer and a free layer. The first to eighth MTJ devices have the structure shown in FIG. 3B, and thus are not described. Moreover, the conduction line for setting the free magnetization directions is omitted for brevity.

Referring to FIG. 7A, the pinned layers of the first and second MTJ devices (711, 712) respectively have a first pinned magnetization 711$pm$ and a second pinned magnetization 712$pm$, at a first pinned direction (dir1). The free layer of the first MTJ device 711 has a first free magnetization 711$fm$ parallel to a first easy-axis (or main-axis) in a direction (dir2) and the free layer of the second MTJ device 712 has a second free magnetization 712$fm$ anti-parallel to the first easy-axis (dir2).

The pinned layers of the third and fourth MTJ devices 723, 724 respectively have a first pinned magnetization 723$pm$ and a second pinned magnetization 724$pm$ at the first pinned direction (dir1). The free layer of the third MTJ device 723 has a first free magnetization 723$fm$ parallel to the first easy-axis (dir2) and the free layer of the fourth MTJ device 724 has a second free magnetization 724$fm$ anti-parallel to the first easy-axis (dir2).

The pinned layers of the fifth to the eighth MTJ devices 735, 736, 747 and 748 respectively have pinned magnetizations of 735$pm$, 736$pm$, 747$pm$ and 748$pm$ at a second pinned direction (the same as dir2). The free layers of the fifth and seventh MTJ devices 735, 747 respectively have a fifth and a seventh free magnetization 735$fm$, 747$fm$ parallel to the first easy-axis (dir2), the free layers of the sixth and eighth MTJ devices 736, 748 respectively have a sixth and an eighth free magnetization 736$fm$, 748$fm$ anti-parallel to the first easy-axis. The first easy-axis is parallel to the second pinned direction (dir2).

Moreover, the pinned magnetizations of the first to eighth MJT devices are set to the desired directions, by applying a plurality of magnetic fields during a multiple-axial annealing process. In FIG. 7A, the angles α, π-α represent the angles between the pinned magnetizations and the free magnetizations in a single MTJ device.

Furthermore, first terminals of the first and fourth TMR sensors 71, 74 are connected to a first voltage node (such as a voltage node VDD); first terminals of the third and second TMR sensors 73, 72 are connected to a second voltage node (such as a reference ground GND); second terminals of the first and third TMR sensors 71, 73 are connected to a test node VB; and second terminals of the second and fourth TMR sensors 72, 74 are connected to a test node VA.

Figure 7B:
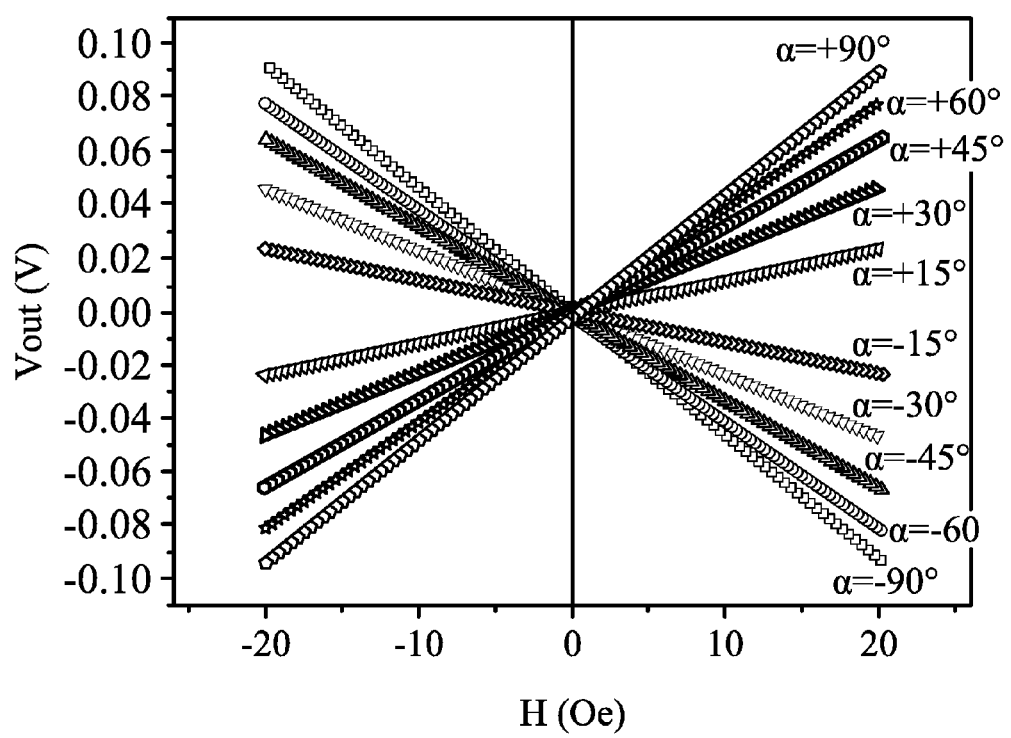
FIG. 7B shows the relationship between output voltages (Vout) of the TMR device 70 in FIG. 7A with respect to the applied magnetic field H, under different angles (α)

FIG. 7B shows the relationship between output voltages (Vout) of the TMR device 70 in FIG. 7A with respect to the applied magnetic field H, under different angles (α). As shown in FIG. 7B, the voltage of the TMR device 50, measured at the test nodes VA and VB is still linear with respect to the applied magnetic field H when α is changed between −90~+90 degrees and the applied magnetic field H is in the range of −20~+20 Oe.

Figure 8A:
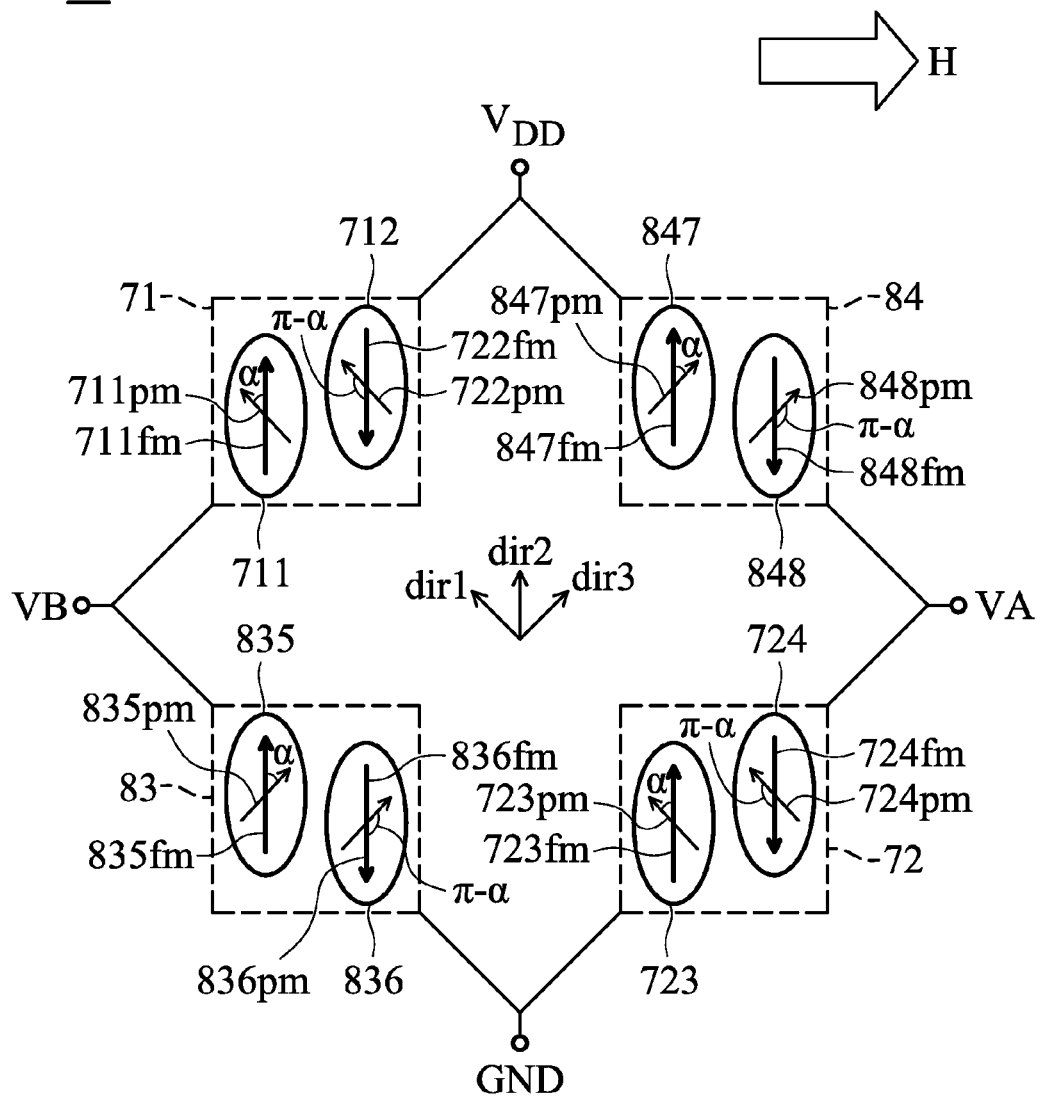
FIG. 8A schematically shows a TMR device 80 with bridge structure according to another exemplary embodiment of the disclosure.

FIG. 8A schematically shows a TMR device 80 with bridge structure according to another exemplary embodiment of the disclosure. For brevity, same numerals and notations are used to indicate the same elements described in FIG. 7A.

The TMR device 80 comprises a first, second, third and fourth TMR sensor 71, 72, 83, 84, the connection structure of which is the same as described in FIG. 7A. The main difference between the TMR device 80 in FIG. 8A and the TMR device 70 in FIG. 7A is the third TMR sensor 83 and the fourth TMR sensor 84.

The third TMR sensor 83 comprises a fifth MTJ device 835 and a sixth MTJ device 836 connected in parallel, each of the fifth and sixth MTJ devices having a pinned layer and a free layer. The fourth TMR sensor 84 comprises a seventh MTJ device 847 and an eighth MTJ device 848 connected in parallel, each of the seventh and eighth MTJ devices having a pinned layer and a free layer.

Referring to FIG. 8A, the pinned layers of the fifth to eighth MTJ devices 835, 836, 847 and 848 respectively have magnetizations of 835$pm$, 836$pm$, 847$pm$ and 848$pm$ at a third pinned direction (dir3). The free layers of the fifth and seventh MTJ devices 835 and 847 respectively have a fifth free magnetization 835$fm$ and a seventh free magnetization 847$fm$ parallel to the first easy-axis (dir2). The free layers of the sixth and eighth MTJ devices 836 and 848 respectively have a sixth free magnetization 836$fm$ and an eighth free magnetization 848$fm$ anti-parallel to the first easy-axis (dir2). In one example, the first pinned direction dir1 is perpendicular to the third pinned direction (dir3).

Moreover, the pinned magnetizations of the first to eighth MJT devices are set to the desired directions, by applying a plurality of magnetic fields during a multiple-axial annealing process. In FIG. 8A, the angles α, π-α represent the angles between the pinned magnetizations and the free magnetizations in a single MTJ device.

Figure 8B:
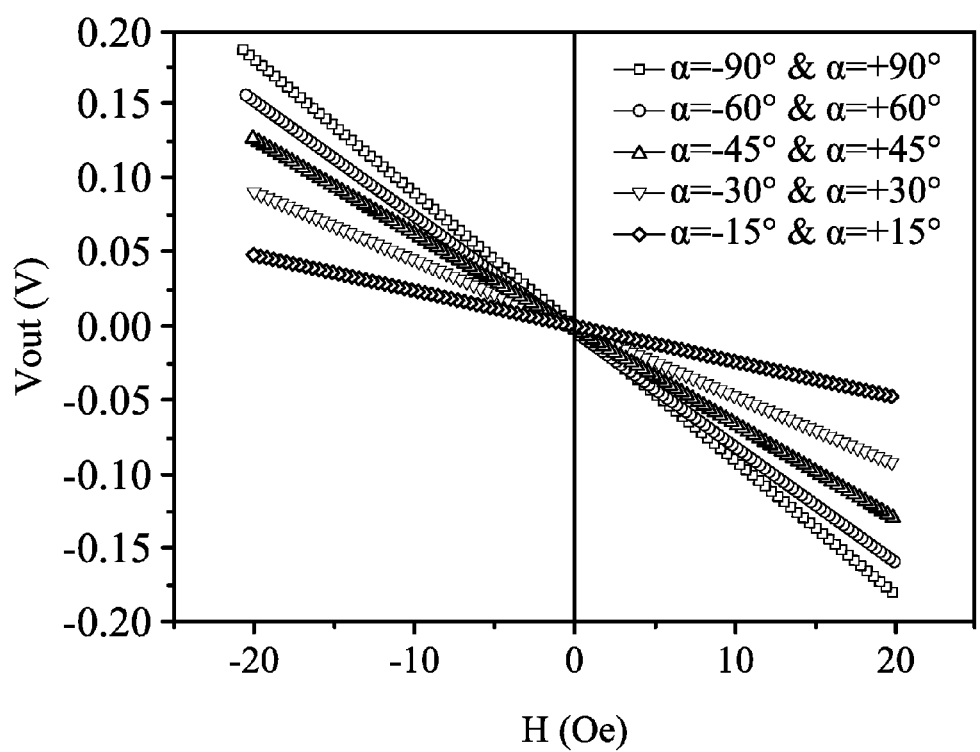
FIG. 8B shows the relationship between output voltages (Vout) of the TMR device 80 in FIG. 8A with respect to the applied magnetic field H, under different angles (α).

FIG. 8B shows the relationship between output voltages (Vout) of the TMR device 80 in FIG. 8A with respect to the applied magnetic field H, under different angles (α). As shown in FIG. 8B, the voltages of the TMR device 80, measured at the test nodes VA and VB is substantially linear with respect to the applied magnetic field H when α is changed between −90~+90 degrees and the applied magnetic field H is in the range of −20~+20 Oe.

In the exemplary embodiments of FIGS. 5A and 7A, the third MTJ sensors 53~54 and the fourth MTJ sensors 73~74 operate as reference units for sensing magnetic fields and, and alternatively can be shielded by shielding layers.

Each TMR sensor in the TMR device of the disclosure comprises two MTJ devices connected in parallel, each of the MTJ devices having a pinned layer and a free layer. Furthermore, the angles (α, π-α) between the free magnetization and the pinned magnetization respectively in the two MTJ devices are complementary. Therefore, the conductance of the TMR sensor is linearly proportional to the variation of the external magnetic field in a tolerable sensing range.

In addition, the TMR device according to the disclosure can provide a bridge structure for sensing magnetic fields by a single annealing process or a multiple-axial annealing process.

While the invention has been described by way of example and in terms of the embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A tunneling magneto-resistor device for sensing magnetic fields, comprising:
   a first TMR (tunneling magneto-resistor) sensor comprising a first and a second MTJ (magnetic tunneling junction) device connected in parallel, each of the first and second MTJ device having a pinned layer and a free layer;
   a second TMR sensor comprising a third and a fourth MTJ device connected in parallel, each of the third and fourth MTJ device having a pinned layer and a free layer;
   a third TMR sensor comprising a fifth and a sixth MTJ device connected in parallel, each of the fifth and sixth MTJ device having a pinned layer and a free layer;
   a fourth TMR sensor comprising a seventh and an eighth MTJ device connected in parallel, each of the seventh and eighth MTJ device having a pinned layer and a free layer;
   wherein each of the pinned layers of the first and second MTJ devices has a pinned magnetization at a first pinned direction; the free layer of the first MTJ device has a first free magnetization parallel to a first easy-axis and the free layer of the second MTJ device has a second free magnetization anti-parallel to the first easy-axis;
   wherein first terminals of the first and fourth TMR sensors are connected to a first voltage node; first terminals of the third and second TMR sensors are connected to a second voltage node; second terminals of the first and third TMR sensors are connected together, and second terminals of the second and fourth TMR sensors are connected together;
   wherein each of the pinned layers of the third and fourth MTJ devices has a pinned magnetization at the first pinned direction; the free layer of the third MTJ device has a third free magnetization parallel to the first easy-axis and the free layer of the fourth MTJ device has a fourth free magnetization anti-parallel to the first easy-axis;
   wherein the first free magnetization and the pinned magnetization of the first MTJ device have a first angle of $\alpha$ degrees therebetween; the third free magnetization and the pinned magnetization of the third MTJ device have the first angle of $\alpha$ degrees therebetween; the second free magnetization and the pinned magnetization of the second MTJ device have an second angle of $\pi-\alpha$ degrees therebetween; the fourth free magnetization and the pinned magnetization of the fourth MTJ device have the second angle of $\pi-\alpha$ degrees therebetween; and $\alpha$ is not zero.

2. The tunneling magneto-resistor device as claimed in claim 1, wherein each of the pinned layers of the fifth to the eighth MTJ devices has a pinned magnetization at the first pinned direction;
   the free layers of the fifth and seventh MTJ devices respectively have a fifth and a seventh free magnetization parallel to a second easy-axis, the free layers of the sixth and eighth MTJ devices respectively have a sixth and an eighth free magnetization anti-parallel to the second easy-axis, and
   the second easy-axis is parallel to the first pinned direction and is not parallel to the first easy-axis.

3. The tunneling magneto-resistor device as claimed in claim 1, wherein each of the pinned layers of the fifth to eighth MTJ devices has a pinned magnetization at a second pinned direction,
   the free layers of the fifth and seventh MTJ devices respectively have a fifth free magnetization and a seventh free magnetization parallel to the first easy-axis, the free layers of the sixth and eighth MTJ devices respectively have a sixth free magnetization and an eighth free magnetization anti-parallel to the first easy-axis, and
   the second pinned direction is parallel to the first easy-axis.

4. The tunneling magneto-resistor device as claimed in claim 2, further comprising shielding devices to respectively shield the third and fourth TMR sensors.

5. The tunneling magneto-resistor device as claimed in claim 3, further comprising shielding devices to respectively shield the third and fourth TMR sensors.

6. The tunneling magneto-resistor device as claimed in claim 1, wherein each of the pinned layers of the fifth to eighth MTJ devices has a pinned magnetization at the first pinned direction,
   the free layers of the fifth and seventh MTJ devices respectively have a fifth free magnetization and a seventh free magnetization parallel to a second easy-axis, the free layers of the sixth and eighth MTJ devices respectively have a sixth free magnetization and an eighth free magnetization anti-parallel to the second easy-axis, and
   the second easy-axis is perpendicular to the first easy-axis.

7. The tunneling magneto-resistor device as claimed in claim 1, wherein each of the pinned layers of the fifth to eighth MTJ devices has a pinned magnetization at a second pinned direction,
   the free layers of the fifth and seventh MTJ devices respectively have a fifth free magnetization and a seventh free magnetization parallel to the first easy-axis, the free layers of the sixth and eighth MTJ devices respectively have a sixth free magnetization and an eighth free magnetization anti-parallel to the first easy-axis, and
   the second pinned direction is perpendicular to the first pinned direction.

8. The tunneling magneto-resistor device as claimed in claim 2, wherein an annealing process is performed to the first to eighth MTJ devices to set the first pinned direction.

9. The tunneling magneto-resistor device as claimed in claim 6, wherein an annealing process is performed to the first to eighth MTJ devices to set the first pinned direction.

10. The tunneling magneto-resistor device as claimed in claim 3, wherein an annealing process is performed to the first to eighth MTJ devices to set the first and the second pinned directions.

11. The tunneling magneto-resistor device as claimed in claim 7, wherein an annealing process is performed to the first to eighth MTJ devices to set the first and the second pinned directions.

* * * * *